United States Patent [19]
Kim et al.

[11] Patent Number: 5,576,999
[45] Date of Patent: Nov. 19, 1996

[54] REDUNDANCY CIRCUIT OF A SEMICONDUCTOR MEMORY DEVICE

[75] Inventors: Jae-Chul Kim; Choong-Keun Kwak, both of Seoul, Rep. of Korea

[73] Assignee: Samsung Electronics Co., Ltd., Suwon, Rep. of Korea

[21] Appl. No.: 491,348

[22] Filed: Jun. 30, 1995

[30] Foreign Application Priority Data

Jun. 30, 1994 [KR] Rep. of Korea .................. 15542/1994

[51] Int. Cl.⁶ .................................................. G11C 7/00
[52] U.S. Cl. ........................ 365/200; 365/201; 365/225.7
[58] Field of Search ................................ 365/200, 225.7, 365/230.03, 201

[56] References Cited

U.S. PATENT DOCUMENTS

| | | | |
|---|---|---|---|
| 5,060,197 | 10/1991 | Park et al. | 365/200 |
| 5,297,088 | 3/1994 | Yamaguchi | 365/200 |
| 5,383,156 | 1/1995 | Komatsu | 365/200 |

*Primary Examiner*—Son T. Dinh
*Attorney, Agent, or Firm*—Cushman Darby & Cushman, L.L.P.

[57] ABSTRACT

A redundancy circuit of the semiconductor memory device having a normal memory cell array for storing data, a redundant memory cell for repairing the fail cells in the normal memory, cell array, a normal decoder for receiving addresses and designating the normal memory cell, a redundancy decoder for selecting the redundant memory cell. The circuit includes a control part which is controlled by a control clock and has fuses for programming fail addresses of the addresses, to be applied, a transmission part which is controlled by an output signal of the control part and has a first path for outputting addresses in-phase with the addresses and a second path for outputting addresses out of phase with the addresses, thereby selecting the first path before repair to select both the normal memory cell and redundant memory cell by the normal and redundancy decoders, and cutting off the fuses corresponding to the fail addresses and selecting the second path during the repair to select the redundant memory cell by the redundancy decoder, thus enabling burn-in of both the normal memory cell and redundant memory cell during the burn-in test.

20 Claims, 5 Drawing Sheets

REDUNDANCY CIRCUIT OF A SEMICONDUCTOR MEMORY DEVICE

BACKGROUND OF THE INVENTION

1. Field of the Invention

The present invention relates to a semiconductor memory device, and more particularly to a redundancy circuit of the semiconductor memory device which is capable of repairing in a package state the fail cells detected after burn-in test.

2. Description of the Related Art

As the semiconductor memory device becomes more and more highly integrated, the number of the memory cells and consequently the number of the fail cells within a chip are increase. Generally, the burn-in test is used to detect these fail cells. Accordingly, the semiconductor memory device should be provided with a redundancy circuit and a redundant memory cell array for repairing the fail cells detected after the burn-in test.

As described in FIG. 1, the operations of fabrication out, pre-laser sorting, laser-repair and sorting are sequentially performed in a wafer state. Thereafter, the burn-in test for removing the fail cells is performed after the package assembly and package sorting in package state.

The fail cell detected in the burn-in test is mainly caused by a single bit fail. The burn-in test is performed for detecting the fail memory cells or testing strength of the memory cells by providing an external power supply voltage or a higher voltage to each memory cell for long time so as to screen the fail cells. The fail cells screened during the burn-in test are discarded even though these have been processed through the test and assembly steps. This results in increasing the time and cost required in repairing the fail cells.

All semiconductor memory devices are therefore provided with the redundancy circuit and redundant memory cell array for repairing the fail cells with redundant cells. The redundancy operation is performed by decoding the address signal designating any fail, cell of the normal memory cell array and then selecting the redundant row or column connected to the redundant memory cell. Such an operation is performed by a redundancy decoder, and whether or not the normal decoder and redundancy decoder are enabled is determined by the output signal of the redundancy circuit for programming the fail addresses. When enabling the redundancy decoder, the redundancy operation is performed by laser-cutting the fuses in the redundancy circuit according to the addresses to be decoded.

FIG. 2 is a diagram illustrating a prior art redundancy circuit. When the fail cells are detected and the redundancy operation is performed, the enable fuses MF1 to MF4 are cut off, to enable the output of the address which is to be decoded. The fuses F1 to F16 are for transmitting the addresses to be decoded, and all the fuses except those connected to the addresses to be decoded are cut off during the redundancy operation so as to avoid the output of the addresses which are not to be decoded. The transmission gates G1 to G16 are turned on during the redundancy operation and are turned off, otherwise. The addresses RA0 to RA3, RB0 to RB3, RC0 to RC3 and RD0 to RD3 are respectively applied from the predecoders (not shown).

The signals AT, BT, CT find DT are respectively outputted from the transmission gates G1 to G16 receiving the addresses RA0 to RA3, RB0 to RB3, RC0 to RC3 and RD0 to TD3. The addresses RA0 to RA3 are inputted and the signal AT is outputted from the fuse corresponding to the fail address. The addresses RB0 to RB3 are inputted and the signal BT is outputted from the fuse corresponding to the fail address. The addresses RC0 to RC3 are inputted and the signal CT is outputted from the fuse corresponding to the fail address. And the addresses RD0 to RD3 are inputted and the signal DT is outputted from the fuse corresponding to the fail address.

The signal ABT is obtained by logic-operating the signals AT and BT through a NAND gate 8, and the signal CDT is obtained by logic-operating the signals CT and DT through a NAND gate 10. An output signal $\phi$ Ri (i=1,2,3,4) of a NOR gate 12 controls the redundancy decoder or normal decoder.

When no fail cell occurs in the normal memory cell array, the fuses of FIG. 2 are not cut off thus turning off the transmission gates G1 to G16. At this time, one input of each of the NAND gates 8 and 10 goes to a logic "low" state by the enable fuses MF3 and MF4. Thus, the NAND gates 8 and 10 respectively output the signals ABT and CDT of logic "high" state, and the NOR gate 12 outputs the output signal $\phi$ Ri (i=1,2,3,4) of logic "low" state. The output signal $\phi$ Ri of logic "low" state enables the normal decoder and disables the redundancy decoder.

When some fail cells occurs in the normal memory cell array, the enable fuses MF1 to MF4 are all cut off, thus enabling a redundancy operation. And the transmission gates G1 to G16 are all turned on, transmitting the received addresses. The fuses except those connected to the addresses to be decoded are all cut off, enabling only the address which is to be decoded (that is, the address designating a predetermined fail cell) to be outputted. For instance, in order to decode the addresses A0, B0, C0 and D0 and to repair the cells corresponding thereto, the fuses except F1, F5, F9 and F13 (in total, 16 fuses including enable fuses MF1 to MF4) should be cut off.

Thereby, the signals AT, BT, CT and DT become the logic "high" state, and the signals ABT and CDT go to the logic "low" state. The NOR gate 12 outputs the output signal $\phi$ Ri of logic "high" state, disabling the normal decoder and enabling the redundancy decoder. However, when decoding a predetermined address at the redundancy operation, the redundancy circuit of FIG. 2 should cut off all the fuses except those connected to the addresses to be decoded. This causes an inefficiency of cutting off 16 fuses in order to receive 4 address signals. In addition, if the fuses that should be cut off are not cut off, the repair operation may not be performed thus lowering the reliability of the redundancy circuit.

The conventional burn-in test has some problems of increasing time and cost required in repairing the fail cells and lowering the burn-in yield. Conventional redundancy circuits of various forms have been provided, however, repairing fail cells has not been properly performed for failures due to a single bit fail, even though a series of operations in the package state have been performed. In addition, there are too many fuses in the redundancy circuit to cut off the fuses effectively. And the disable of the redundancy operation caused by not properly cutting off the fuses results in lowering the reliability of the semiconductor memory device.

SUMMARY OF THE INVENTION

It is therefore an object of the present invention to provide a redundancy circuit of a semiconductor memory device which is capable of burning-in both the normal memory cell and redundant memory cell in response to an address during burn-in test.

It is another object of the present invention to provide the redundancy circuit of the semiconductor memory device which is capable of repairing the fail cells due to a single bit .fail which have been detected after the burn-in test.

It is still another object of the present invention to provide the redundancy circuit of the semiconductor memory device which is capable of performing the reliable redundancy operation by cutting off the fuses effectively.

In carrying out the above and other objects of the present invention, the redundancy circuit of the semiconductor memory device includes a normal memory cell array for storing data, a redundant memory cell for repairing the fail cells in the normal memory cell array, a normal decoder for receiving addresses and designating normal memory cell, a redundancy decoder for selecting the redundant memory cell. The redundancy circuit also includes a control part which is controlled by a control clock and has fuses for programming fail addresses of the addresses, to be applied, a transmission part which is controlled by an output signal of the control part and has a first path for outputting addresses in-phase with the addresses and a second path for outputting addresses out of phase with the addresses, thereby selecting the first path before repair to select both the normal memory cell and redundant memory cell by the normal and redundancy decoders, and cutting off the fuses corresponding to the fail addresses and selecting the second path during the repair to select the redundant memory cell by the redundancy decoder, thus burning-in both the normal memory cell and redundant memory cell during the burn-in test.

BRIEF DESCRIPTION OF THE DRAWINGS

In the detailed description of the preferred embodiment of the present invention presented below, reference is made to the accompanying drawings, in which.

DETAILED DESCRIPTION OF THE PREFERRED EMBODIMENT

Figure 1:
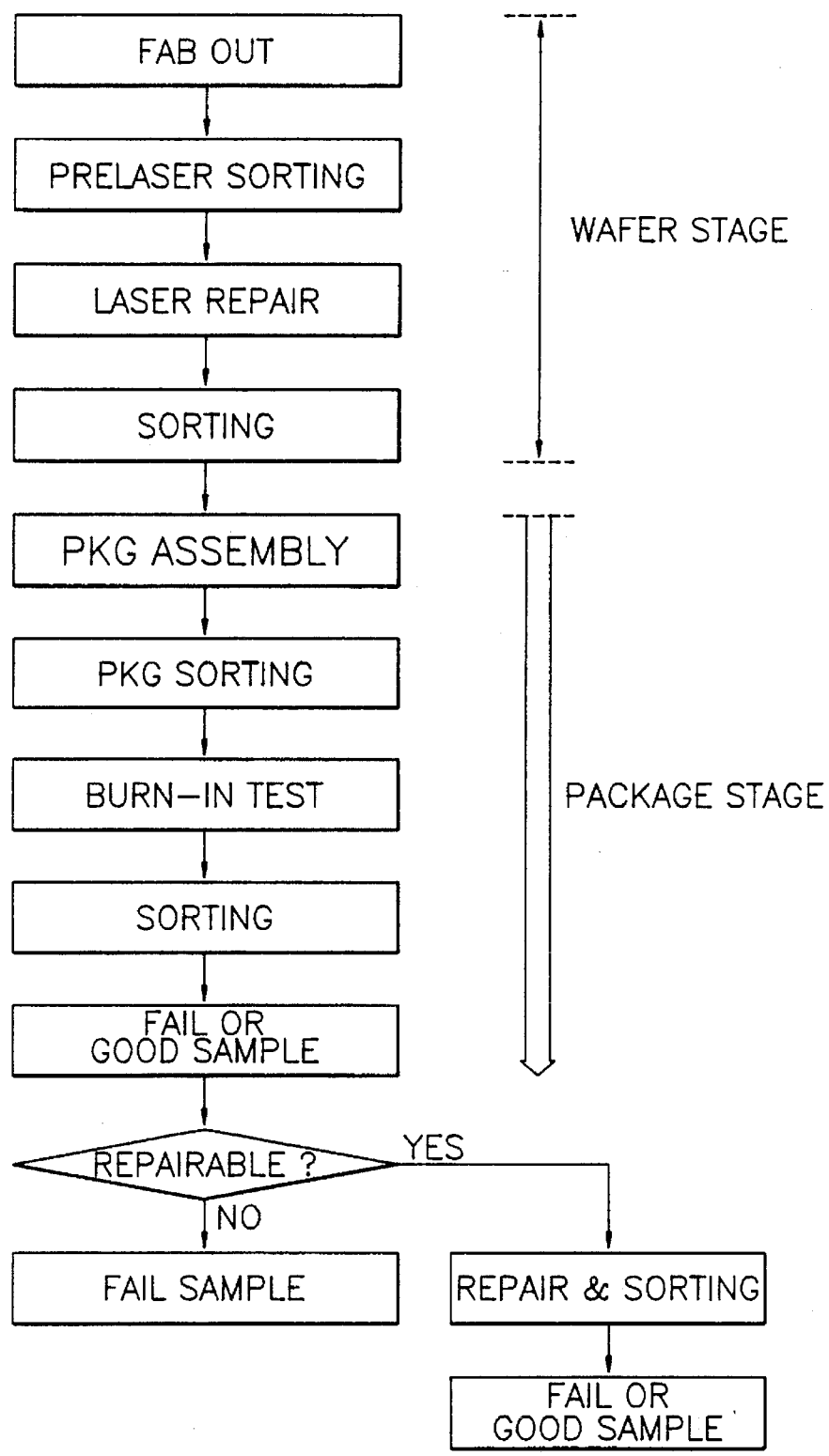
FIG. 1 is a flow diagram showing the general process for repairing the fail cells.
Figure 2:
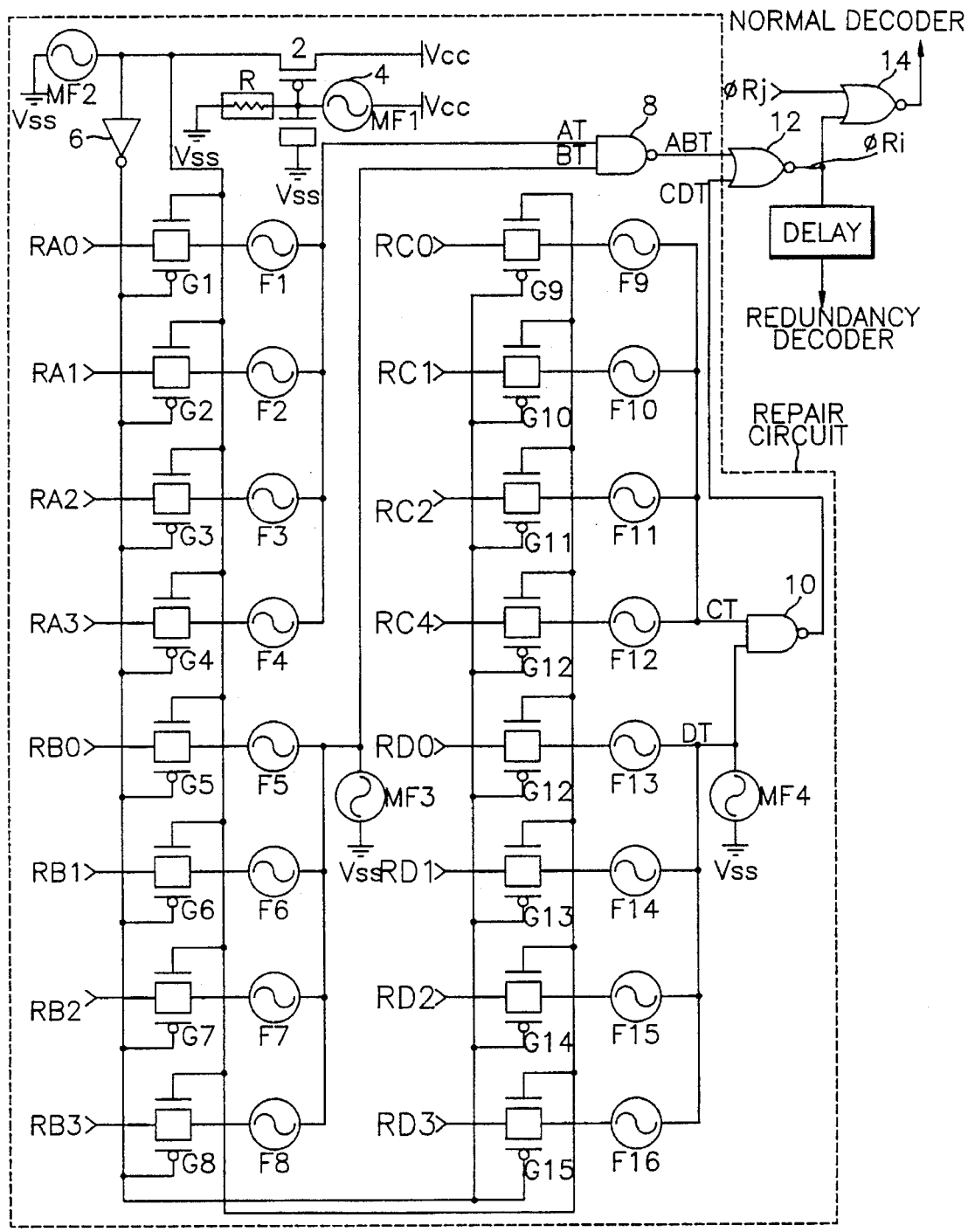
FIG. 2 illustrates a prior art redundancy circuit.
Figure 3:
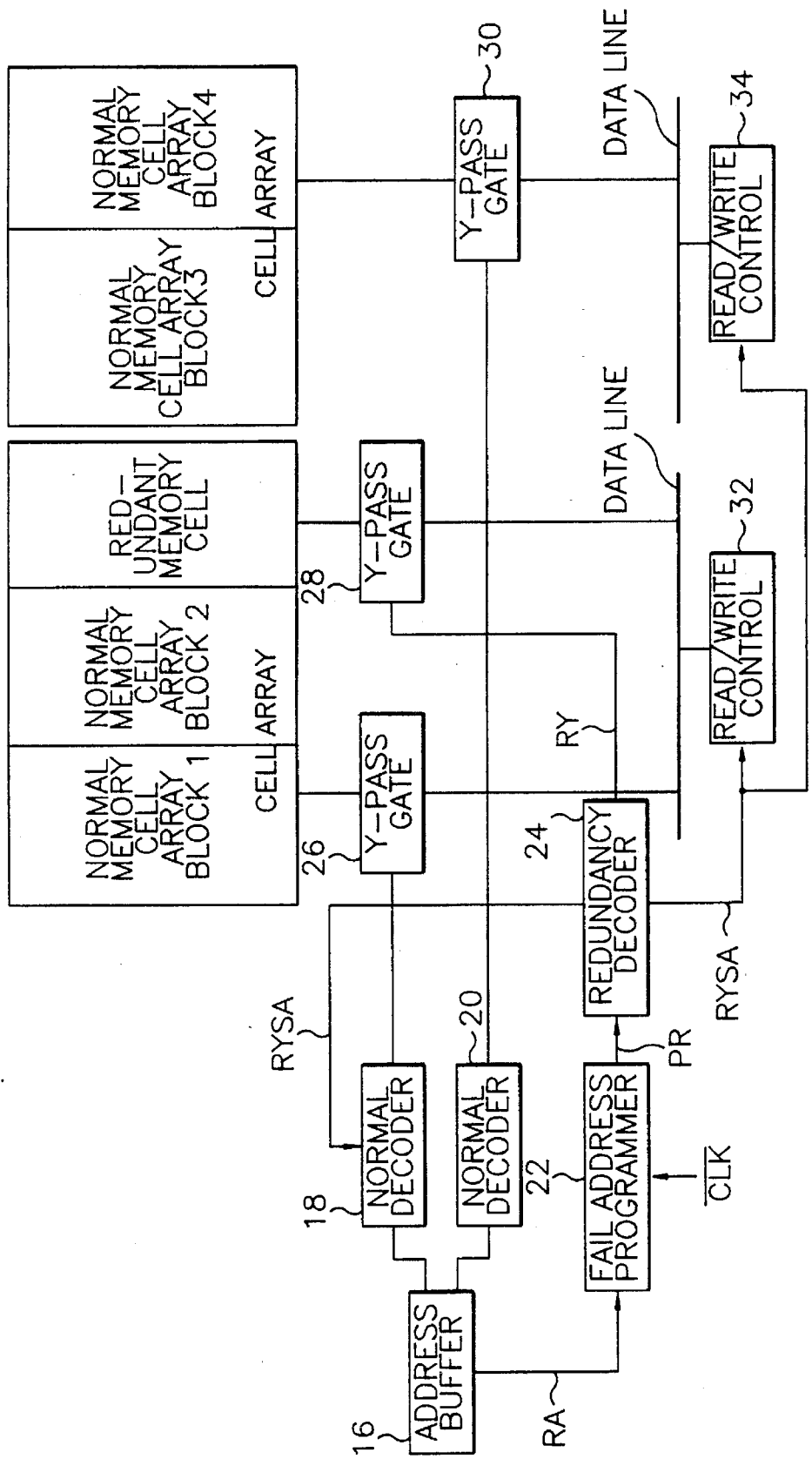
FIG. 3 shows the construction of the chip of the general semiconductor memory device.

FIG. 3 is a block diagram showing the construction of the chip of the general semiconductor memory device, wherein two normal memory cell array blocks share one data line. The data lines are controlled by read/write control circuits 32 and 34 respectively connected thereto. An address buffer 16 buffers and applies addresses to normal decoders 18 and 20. The normal decoder 18 applies a normal decoding signal to a Y-pass gate 26 which controls the first and second normal memory cell array blocks. The normal decoder 20 applies a normal decoding signal to a Y-pass gate 30 which controls the third and fourth normal memory cell array blocks. These normal decoding signals designate the normal memory cell in the first to fourth normal memory cell array blocks. A redundancy decoder 24 receives a program address from the redundancy circuit and then controls the redundant memory cell.

In the case that the repaired addresses access the first or second memory cell array block, the signal RYSA, indicating that the redundancy path is enabled, is applied to the normal decoder 18. As a result, the Y-pass gate 26 of normal path is disabled, to output data from the redundant memory cell. In the case that the repaired addresses designate the third and fourth memory cell array blocks, the Y-pass gates 28 and 30 are all enabled, however, data is outputted only from the data line connected to the redundant memory cell as the signal RYSA controls the read/write control circuit 32.

Figure 4:
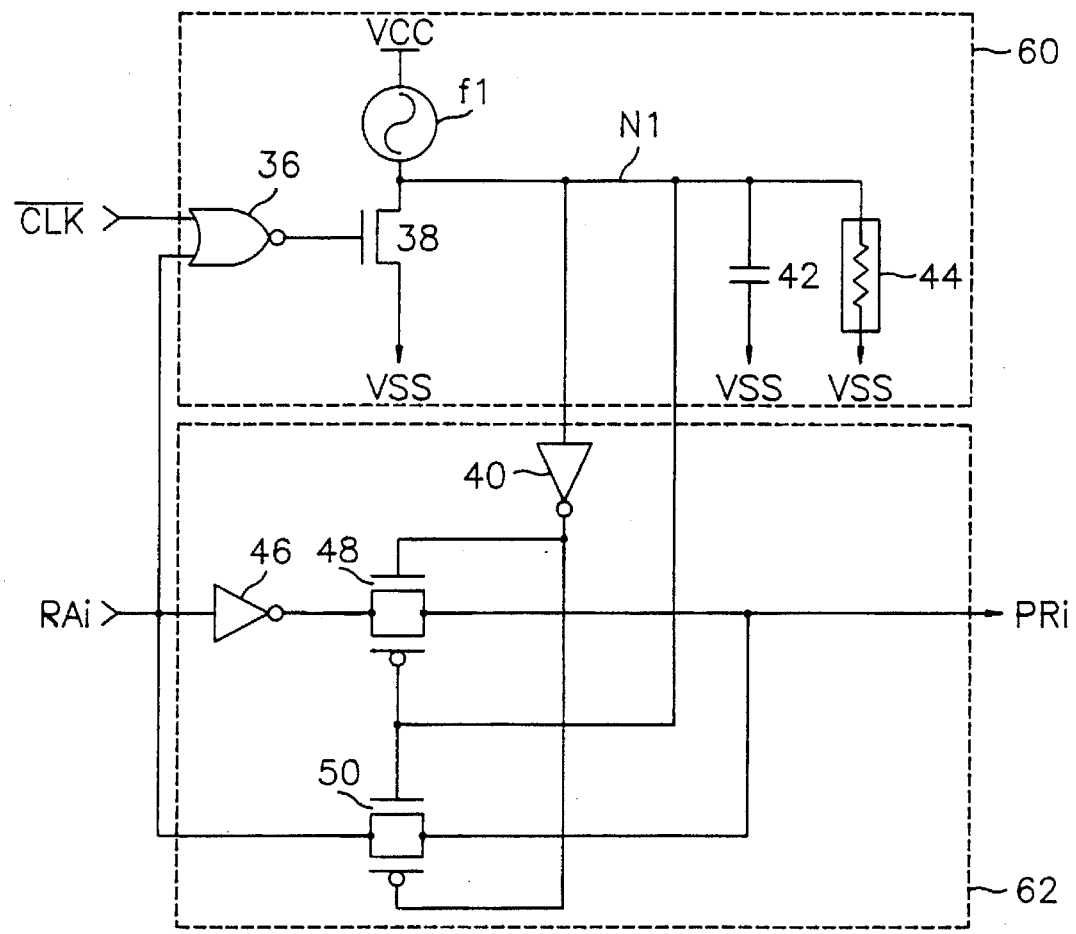
FIG. 4 is a diagram of a redundancy circuit according to the present invention.

FIG. 4 is a diagram showing a redundancy circuit according to the present invention. The redundancy circuit shown in FIG. 4 receives the address RAi and the control clock $\overline{CLK}$, and then outputs the program address PRi according to the state of the control clock $\overline{CLK}$ and fuse f1. In the preferred embodiment of FIG. 4, if 6 addresses are applied, 6 redundancy circuits should be provided corresponding thereto. In FIG. 4, a single fuse is provided to program an address, however, in order to program a plurality of addresses, a plurality of fuses corresponding to the addresses should be provided.

The redundancy circuit of FIG. 4 comprises a control part 60 having a NOR gate 36 for receiving the control clock $\overline{CLK}$ and the address RAi, a fuse f1 connected between a power supply voltage Vcc and an output node N1, an NMOS transistor 38 connected between the output node N1 and ground Vss, for determining whether to make the output node N1 discharge according to the output signal of the NOR gate 36, and capacitor 42 and resistor 44 connected between the output node N1 and the ground Vss, and a transmission part 62 having an inverter 46 for receiving and inverting the address RAi, an inverter 40 for inverting the signal from the output node N1, a transmission gate 48 for transmitting the output signal of the inverter 46, and a transmission gate 50 for transmitting the address RAi, thereby outputting the program address PRi.

Assuming that the number of the redundancy circuits is determined corresponding to the number of the addresses to be received, the operation of the redundancy circuit of FIG. 4 will be described in detail. The control clock $\overline{CLK}$ is enabled when repairing the fail cells with the redundant cells, and maintains the logic "high" state before the repairing operation.

The operation of the redundancy circuit before the repairing operation will now be described. As the control clock $\overline{CLK}$ maintains the logic "high" state, the output node N1 becomes the logic "high" state, turning on the transmission gate 50 and turning off the transmission gate 48. Hence, before the repairing operation, the addresses RAi to RA6 are transmitted without being inverted and become the program addresses PR1 to PR6. That is, if the logic state of the addresses RA1 to RA6 is '111111', the logic state of the program addresses PR1 to PR6 is also '111111'. Thereafter, the program addresses PR1 to PR6 are applied to the redundancy decoder. Before the repairing operation, if the program addresses PR1 to PR6 are in the logic "high" state, both the normal memory cell and redundant memory cell are selected by the normal and redundancy decoders, respectively. Otherwise, only the normal memory cell is selected and the redundant memory cell is not selected. This means that the redundancy circuit capable of repairing the fail memory cell in the package state, enables the burn-in of both the normal memory cell and redundant memory cell in response to an address in the burn-in test.

The operation of repairing the fail cells screened after the burn-in test will now be described. If the addresses RA1 to RA6 are in the logic "high" state, the program addresses PR1 to PR6 become logic "high" state, thus selecting the redundant memory cell. For that reason, the redundancy circuit has only to repair the address '0' of the fail addresses. Such an operation is possibly performed by cutting off the fuse f1 corresponding to the address '0', by turning off the transmission gate 50 for transmitting the addresses in-phase with the addresses RA1 to RA6, and turning on the transmission gate 48 for transmitting the addresses out of phase with the addresses RA1 to RA6.

Assuming that the logic state of the fail addresses is '010101', the fail addresses are programmed as follows. In order to program the first address '0' of the fail addresses '010101', the addresses RA1 to RA6 are set to the logic state '011111', and then the control clock $\overline{CLK}$ of logic "low" is inputted, to cut off the fuse f1. With these operations, the output of the NOR gate 36 becomes logic "high" state, the NMOS transistor 38 is turned on, and the fuse f1 is cut off, thus discharging the voltage of the output node N1. Thereby, the transmission gate 50 is turned off, and the transmission gate 48 is turned on, outputting the program address '1' which is out of phase with the address '0'.

In order to program the third address '0' of the fail addresses '010101', the addresses RA1 to RA6 are set to the logic state '110111', and then the control clock $\overline{CLK}$ of logic "low" state is inputted, to cut off the corresponding fuse. In the same way, in order to program the fifth address '0' of the fail addresses '010101', the addresses RA1 to RA6 are set to the logic state '111101', and then the control clock $\overline{CLK}$ of logic "low" state is inputted, to cut off the corresponding fuse. That is, the redundancy circuit according to the present invention is capable of programming the fail addresses by cutting off the fuses on the basis of the logic state of one of the fail addresses.

Accordingly, when the logic state of the fail addresses is '010101', the program addresses PR1 to PR6 become the logic "high" state of '111111', thus selecting the redundancy memory cell array.

The redundancy circuit according to the present invention comprises a transmission part 62 having a first path for outputting addresses in-phase with the addresses and a second path for outputting addresses out of phase with the addresses, thereby selecting the first path before repair to select both the normal memory cell and redundant memory cell by the normal and redundancy decoders, and cutting off the fuses corresponding to the fail addresses and selecting the second path during the repairing operation to select the redundant memory cell by the redundancy decoder.

Figure 5:
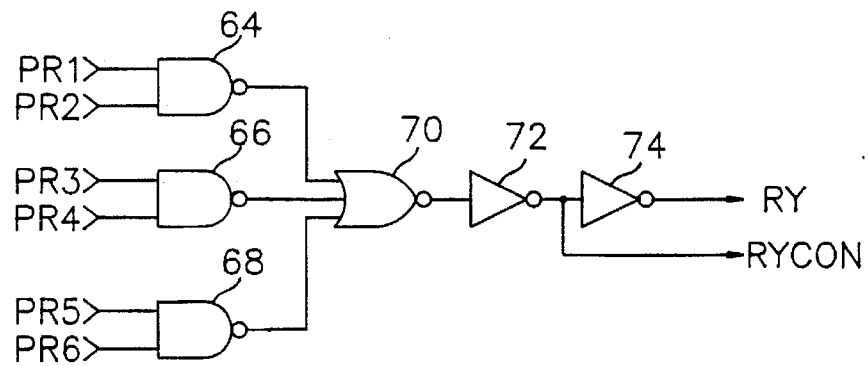
FIG. 5 is a diagram showing the construction of the redundancy decoder according to the present invention.

FIG. 5 is a diagram showing the redundancy decoder according to the present invention. The redundancy decoder of FIG. 5 receives the program addresses PR1 to PR6 from the redundancy circuit of FIG. 4 and then generates control signal RYCON and signal RY for controlling the Y-pass gate 28 connected to the redundant memory cell.

Figure 6:
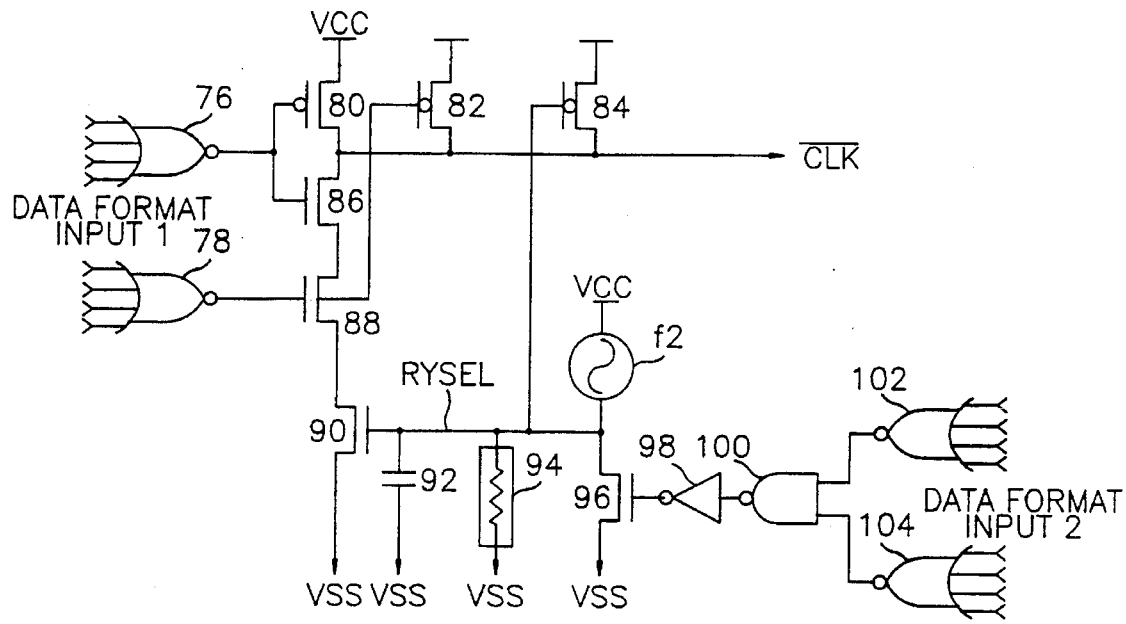
FIG. 6 is a diagram showing a control clock generator according to FIG. 4.

FIG. 6 is a diagram showing a control clock generator according to FIG. 4. The control clock generator receives the first and second data formats and then outputs the control clock $\overline{CLK}$. The control clock generator comprises NOR gates 76 and 78 for receiving the first data format, PMOS transistor 80 and NMOS transistor 86 having their gates connected to the output terminal of the NOR gate 76, a PMOS transistor 82 connected between the power supply voltage Vcc and the output node $\overline{CLK}$, with its gate connected to the output terminal of the NOR gate 78, a PMOS transistor 84 connected between the power supply voltage Vcc and the output node $\overline{CLK}$, with its gate connected to the node RYSEL, an NMOS transistor 88 having its gate connected to the output terminal of the NOR gate 78, NOR gates 102 and 104 for receiving the second data format, a NAND gate 100 for receiving the output signals of the NOR gates 102 and 104, an inverter 98 for inverting the output signal of the NAND gate 100, a fuse f2 connected between the power supply voltage Vcc and the node RYSEL, an NMOS transistor 96 connected between the fuse t2 and ground Vss, with its gate connected to the output of the inverter 98 and capacitor 92 and resistor 94 connected between the node RYSEL and the ground Vss.

The control clock $\overline{CLK}$ of the logic "low" state should be applied to the redundancy circuit of FIG. 4 so as to program the fail addresses. For this, the first data format is set, for example, to '11001100', making the control clock $\overline{CLK}$ logic "low" state. After programming the fail addresses, the second data format of '00110011' is applied to the control clock generator, making the output of the inverter 98 logic "high" state. Thereafter the fuse 12 is cut off, making the node RYSEL logic "low" state. The PMOS transistor 84 is thus turned on, to output the control clock $\overline{CLK}$ of logic "high" state. Namely, the control clock $\overline{CLK}$ becomes disabled in order to avoid the fuse f1 being cut off unexpectedly in using the chip after the sample out.

As aforementioned, the first data format '11001100' and the second data format '00110011' can be used as the specific data of '00000000', '11111111', '01010101', and '10101010' are used during the chip test.

Figure 7:
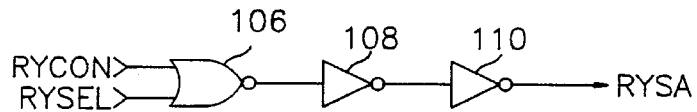
FIG. 7 is a diagram showing a redundancy access detector according to the present invention.

FIG. 7 is a diagram showing the redundancy access detector according to the present invention. The redundancy access detector generates the signal RYSA indicating of the enable of the redundancy path. During the burn-in test, both the redundancy memory cell and normal memory cell should be selected in response to the address input '111111', and the signal RYSA is thus disabled to the logic "low" state. This is because the node RYSEL of FIG. 6 remains the logic "high" state before the repairing operation. Thereby, the normal decoder 18 connected to the first and second normal memory cell array blocks is enabled to select both the normal and redundant memory, cells. After a repairing operation, as the node RYSEL becomes the logic "low" state, the NOR gate 106 is controlled only by the control signal RYCON.

Figure 8:
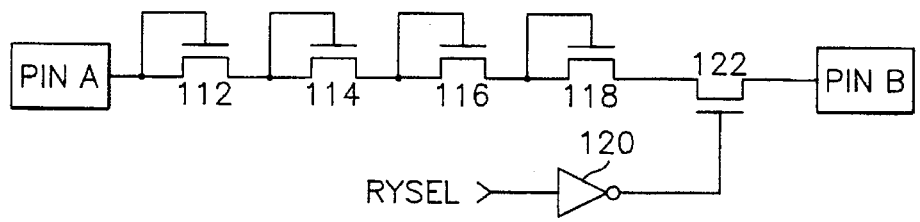
FIG. 8 is a diagram showing a fuse cutting confirmation circuit according to FIG. 6.

FIG. 8 shows a fuse cutting confirmation circuit for confirming whether or not the fuse f2 of the control clock generator is cut off. The fuse cutting confirmation circuit comprises NMOS transistors 112, 114, 116 and 118 connected between the pin A and pin B, and an NMOS transistor 122 connected to the node RYSEL of the control clock generator through the inverter 120. In the control clock generator of FIG. 6, if the fuse f2 is cut off, the node RYSEL becomes the logic "low" state. Thus, the output signal of the inverter 120 goes to the logic "high" state. At this time, an A to B current path is formed by coupling the pin B to ground and the pin A to a high voltage, and with this current value, whether or not the fuse f2 is cut off can be confirmed.

As described above, the redundancy circuit of the semiconductor memory device repairing the fail cells in the package state, is capable of burning-in both the normal memory cell and the redundancy memory cell in response to a specific address during the burn-in test. In addition, the redundancy circuit is capable of repairing the fail cells due to a single bit fail and of performing a reliable redundancy operation by cutting off the fuses effectively.

What is claimed is:

1. A redundancy circuit of a semiconductor memory device having a normal memory cell array for storing data, redundant memory cells for repairing fail cells in said normal memory cell array, a normal decoder for receiving addresses, each said address including a plurality of bits, each bit having an input state being one of a first state and a second state opposite said first state, said normal decoder designating corresponding normal memory cells in said normal memory cell array, and a redundancy decoder for selecting said redundant memory cells, said redundancy circuit comprising:

a control circuit which is operative to receive said addresses and to detect addresses which have fail addresses corresponding to said fail cells, said control circuits cutting fuses which correspond to bits of each fail address having said first state, and, upon subsequent input of one of said fail addresses, outputting a control signal corresponding thereto; and a transmission circuit which receives said addresses and has a first path for outputting certain of said bits of each said address and a second path for outputting remaining bits of each said address with a state opposite said input state, one of said first path and said second path being selected for each bit in accordance with each said control signal of said control circuit.

2. The redundancy circuit according to claim 1, wherein each of said fuses is coupled between a power supply voltage and an output node which discharges according to a corresponding bit of said fail addresses and a control clock.

3. The redundancy circuit according to claim 2, wherein said control circuit includes a single fuse corresponding to each of said bits of said addresses in order to program each bit of each said fail addresses.

4. The redundancy circuit according to claim 3, wherein each of said fuses are cut off on the basis of said first state of corresponding bits of said fail addresses.

5. The redundancy circuit according to claim 4, wherein said first state is a logic low state.

6. The redundancy circuit according to claim 4, wherein said first state is a logic high state.

7. The redundancy circuit according to claim 3, wherein said control signal is a control signal having a plurality of bits, each bit corresponding to one of said plurality of bits of said addresses.

8. The redundancy circuit according to claim 1, wherein said control circuit cuts said fuses to repair said fail cells in a package state which are detected after a burn-in test.

9. The redundancy circuit according to claim 2, further comprising a control clock generator which receives first and second data formats and outputs said control clock in accordance therewith.

10. The redundancy circuit according to claim 9, wherein said control clock generator includes a control fuse which is cut after a programming operation to thereafter disable output of said control clock.

11. The redundancy circuit according to claim 1, further comprising a logic circuit which receives said bits output by said transmission circuit and which generates a signal for said redundancy decoder to select said redundant memory cells according to said bits.

12. The redundancy circuit according to claim 11, wherein said logic circuit is comprised of a plurality of NAND gates.

13. A redundancy circuit of a semiconductor memory device having a normal memory cell array for storing data, redundant memory cells for repairing fail cells in said normal memory cell array which are detected during a burn-in test, a normal decoder for receiving addresses, each said address including a plurality of bits, each bit having an input state being one of a first state and a second state opposite said first state, said normal decoder designating corresponding normal memory cells in said normal memory cell array, and a redundancy decoder for selecting said redundant memory cells, said redundancy circuit comprising:

a control circuit which is operative to receive said addresses and to detect addresses which have fail addresses corresponding to said fail cells, said control circuit outputting a control signal corresponding to each bit of said addresses, said control circuit being operative to cut fuses corresponding to bits of each said fail address during a programming operation after said burn-in test to repair said fail cells when said semiconductor memory device is in a package state; and a transmission circuit which receives said addresses and has a first path for outputting certain of said bits of each said address and a second path for outputting remaining bits of each said address with a state opposite said input state, said first path being selected during said burn-in test to output all bits of each said address to burn in both said normal memory cells and said redundant memory cells, and one of said first path and said second path being selected after said programming operation for each bit in accordance with each said control signal of said control circuit.

14. The redundancy circuit according to claim 13, wherein said control circuit cuts fuses which correspond to bits of each fail address having said first state, and, upon subsequent input of one of said fail addresses, outputs a control signal corresponding thereto.

15. The redundancy circuit according to claim 14, wherein each of said fuses is coupled between a power supply voltage and an output node which discharges according to a corresponding bit of said fail addresses and a control clock.

16. The redundancy circuit according to claim 15, wherein said control circuit includes a single fuse corresponding to each of said bits of said addresses in order to program each bit of each said fail addresses.

17. The redundancy circuit according to claim 16, wherein each of said fuses are cut off on the basis of said first state of corresponding bits of said fail addresses.

18. The redundancy circuit according to claim 16, wherein said control signal is a control signal having a plurality of bits, each bit corresponding to one of said plurality of bits of said addresses.

19. The redundancy circuit according to claim 15, further comprising a control clock generator which receives first and second data formats and outputs said control clock in accordance therewith.

20. The redundancy circuit according to claim 19, wherein said control clock generator includes a control fuse which is cut after a programming operation to thereafter disable output of said control clock.

* * * * *